(12) United States Patent
Park et al.

(10) Patent No.: US 8,871,635 B2
(45) Date of Patent: Oct. 28, 2014

(54) INTEGRATED CIRCUITS AND PROCESSES FOR FORMING INTEGRATED CIRCUITS HAVING AN EMBEDDED ELECTRICAL INTERCONNECT WITHIN A SUBSTRATE

(75) Inventors: Chanro Park, Clifton Park, NY (US); Errol T. Ryan, Clifton Park, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 21 days.

(21) Appl. No.: 13/466,895

(22) Filed: May 8, 2012

(65) Prior Publication Data
US 2013/0299994 A1 Nov. 14, 2013

(51) Int. Cl.
*H01L 21/4763* (2006.01)

(52) U.S. Cl.
USPC ............ 438/627; 438/643; 257/751; 257/774

(58) Field of Classification Search
CPC .............. H01L 23/48; H01L 21/76834; H01L 21/76832; H01I 21/76883
USPC .................................................. 438/627, 643
See application file for complete search history.

(56) References Cited

U.S. PATENT DOCUMENTS

| | | | | |
|---|---|---|---|---|
| 5,173,438 A | * | 12/1992 | Sandhu | 438/450 |
| 6,004,188 A | * | 12/1999 | Roy | 451/41 |
| 6,191,029 B1 | * | 2/2001 | Hsiao et al. | 438/633 |
| 6,774,041 B1 | * | 8/2004 | Kondo et al. | 438/692 |
| 8,232,200 B1 | * | 7/2012 | Oh et al. | 438/643 |
| 2003/0003711 A1 | * | 1/2003 | Modak | 438/629 |
| 2007/0155165 A1 | * | 7/2007 | Park et al. | 438/629 |
| 2008/0171447 A1 | | 7/2008 | Wallow et al. | |
| 2009/0023298 A1 | | 1/2009 | Deng et al. | |
| 2009/0283907 A1 | * | 11/2009 | Goswami et al. | 257/751 |
| 2011/0097896 A1 | * | 4/2011 | Daamen et al. | 438/643 |

OTHER PUBLICATIONS

Lu et al., "Reproducible Resistive-Switching Behavior in Copper-Nitride Thin Film Prepared by Plasma-Immersion Ion Implantation," Phys. Status Solidi A 208, No. 4, pp. 874-877, (2011).
Nosaka et al., "Thermal Decomposition of Copper Nitride Thin Films and Dots Formation by Electron Beam Writing," Applied Surface Science, 169-170, pp. 358-361, (2001).
U.S. Appl. No. 13/362,981, filed Jan. 31, 2012.

* cited by examiner

*Primary Examiner* — Thao X Le
*Assistant Examiner* — Laura Dykes
(74) *Attorney, Agent, or Firm* — Ingrassia Fisher & Lorenz, P.C.

(57) ABSTRACT

Integrated circuits and processes for forming integrated circuits are provided. An exemplary process for forming an integrated circuit includes providing a substrate including an oxide layer and a protecting layer disposed over the oxide layer. A recess is etched through the protecting layer and at least partially into the oxide layer. A barrier material is deposited in the recess to form a barrier layer over the oxide layer and protecting layer in the recess. Electrically-conductive material is deposited over the barrier layer in the recess to form the embedded electrical interconnect. The embedded electrical interconnect and barrier layer are recessed to an interconnect recess depth and a barrier recess depth, respectively, within the substrate. At least a portion of the protecting layer remains over the oxide layer after recessing the barrier layer and is removed after recessing the barrier layer.

17 Claims, 6 Drawing Sheets

INTEGRATED CIRCUITS AND PROCESSES FOR FORMING INTEGRATED CIRCUITS HAVING AN EMBEDDED ELECTRICAL INTERCONNECT WITHIN A SUBSTRATE

TECHNICAL FIELD

The present invention generally relates to integrated circuits and processes for forming integrated circuits having an embedded electrical interconnect within a substrate of the integrated circuit. More particularly, the present invention relates to integrated circuits and processes for forming integrated circuits having an embedded electrical interconnect recessed within a substrate and with a barrier layer disposed between the embedded electrical interconnect and the substrate.

BACKGROUND

Embedded electrical interconnects within dielectric substrates find widespread use for various electronic applications. For example, microprocessor integrated circuits generally include numerous levels of interconnect routing in the form of electrical interconnects, such as lines and dots, embedded within a dielectric substrate to connect transistors within the integrated circuits. Each level of interconnect routing is separated from immediately adjacent levels by the dielectric material, referred to in the art as an interlayer dielectric (ILD). The ILD generally includes an oxide layer that includes an oxide, such as silicon dioxide formed from tetraethyl orthosilicate (TEOS), and may include one or more additional layers of dielectric material such as low-k or ultra-low k (ULK) material. Adjacent levels of interconnect routing may be embedded in distinct layers of ILD, and with the interconnect routing configured in such a way so as to ensure that dielectric material separates the adjacent interconnect routings. In this regard, the embedded electrical interconnects in the interconnect routing can be selectively insulated from both other embedded electrical interconnects in the same interconnect routing and from embedded electrical interconnects in interconnect routing of adjacent levels. Likewise, embedded electrical interconnects in adjacent levels of interconnect routing can also be selectively connected to fabricate desired circuitry in the integrated circuits.

With advances in integrated circuits, driven by a desire to shrink sizes, aspect ratios of height to width of the embedded electrical interconnects in the interconnect routing have been maximized to enable spacing between the embedded electrical interconnects to be minimized. However, the minimized spacing between the embedded electrical interconnects gives rise to device reliability concerns that are attributable to various phenomena. One particular phenomena that gives rise to reliability concerns is time dependent dielectric breakdown (TDDB), which results from migration of metal ions from the embedded electrical interconnects into an interface between adjacent levels of the interconnect routing. TDDB is often exacerbated with decreased spacing between embedded electrical interconnects in the interconnect routings. To combat TDDB, efforts have been made to recess the embedded electrical interconnects within the ILD, thereby offsetting surfaces of the embedded electrical interconnects from a plane of the interface between the adjacent levels and effectively forming a barrier to flow of metal ions into the interface. In particular, during formation of the levels of interconnect routing, a layer of ILD is formed over a base substrate, which may be a semiconductor substrate or another level of interconnect routing. Trenches and/or vias are etched into the ILD, followed by deposition of an electrically-conductive material into the trenches and/or vias. Excess electrically-conductive material is removed through chemical and/or mechanical removal techniques to define the interconnect routing of embedded electrical interconnects. Wet etch techniques are then employed to etch electrically-conductive material from the exposed surfaces of the embedded electrical interconnects to thereby recess the embedded electrical interconnects within the ILD prior to forming additional layers thereon.

As a further feature to minimize TDDB attributable to migration of metal ions from the embedded electrical interconnects into the interface between adjacent levels of the interconnect routing, a barrier layer is often formed in the trenches and/or vias prior to depositing the electrically-conductive material in the trenches and/or vias. The barrier layer generally includes a barrier material such as tantalum nitride. A liner layer of liner material such as tantalum may be formed over the barrier layer prior to depositing the electrically-conductive material in the trenches and/or vias to further assist as a barrier to flow of metal ions into the interface. Recessing of the barrier layer and the liner layer within the substrate is desirable to promote electrical insulation of the embedded electrical interconnects and to further minimize TDDB. However, wet etch techniques that are employed to remove electrically-conductive material from the exposed surfaces of the embedded electrical interconnects do not etch the barrier material at the same rate as the electrically-conductive material. Further, dry etch techniques that are generally effective for etching tantalum nitride and tantalum also etch the oxide layer in the ILD at a high rate, which gives rise to reliability concerns in the integrated circuit by causing uneven topography, reducing the volume of ILD that separates the interconnect routing, and breaking down the oxide layer.

Accordingly, it is desirable to provide processes for forming integrated circuits having an embedded electrical interconnect within a substrate in which the embedded electrical interconnect is recessed within the substrate and that enables a barrier layer that is disposed between the substrate and the embedded electrical interconnect to also be effectively recessed within the substrate while minimizing etching of the oxide layer in the substrate. In addition, it is desirable to provide integrated circuits having a substrate with an embedded electrical interconnect recessed therein and with a barrier layer disposed between the embedded electrical interconnect and the substrate with the barrier layer also being recessed in the substrate. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and processes for forming integrated circuits are provided. In an embodiment, a process for forming an integrated circuit includes providing a substrate including an oxide layer and a protecting layer disposed over the oxide layer. A recess is etched through the protecting layer and at least partially into the oxide layer. A barrier material is deposited in the recess to form a barrier layer over the protecting layer and the oxide layer in the recess. An electrically-conductive material different from the barrier material is deposited over the barrier layer in the recess to form an embedded electrical interconnect. The embedded electrical interconnect is recessed to an interconnect recess depth within the substrate. The barrier layer is recessed to a barrier recess depth within the substrate after recessing the embedded electrical interconnect, and at least a portion of the protecting layer remains over the oxide layer after recessing the barrier layer. The protecting layer is removed from the oxide layer after recessing the barrier layer.

In another embodiment, a process for forming an integrated circuit includes providing a substrate including an underlying dielectric layer, an oxide layer disposed over the underlying dielectric layer, and a protecting layer disposed over the oxide layer. A recess is etched through the protecting layer, at least partially into the oxide layer, and optionally at least partially into the underlying dielectric layer. A barrier material is deposited in the recess to form a barrier layer over the protecting layer, the oxide layer, and optionally the underlying dielectric layer in the recess. A liner material different from the barrier material is deposited over the barrier layer in the recess to form a liner layer. An electrically-conductive material is deposited over the liner layer in the recess to form an embedded electrical interconnect. The embedded electrical interconnect is wet etched to an interconnect recess depth within the substrate. The barrier layer is dry etched to a barrier recess depth within the substrate after recessing the embedded electrical interconnect. At least a portion of the protecting layer remains over the oxide layer after recessing the barrier layer. The protecting layer is removed from the oxide layer after recessing the barrier layer.

In another embodiment, an integrated circuit includes a base substrate and an interlayer dielectric substrate disposed over the base substrate. The interlayer dielectric substrate has an embedded electrical interconnect disposed therein and a barrier layer disposed between the embedded electrical interconnect and the interlayer dielectric substrate. The embedded electrical interconnect and barrier layer are recessed within the interlayer dielectric substrate and have a recessed interconnect surface and a recessed barrier surface, respectively. The recessed barrier surface is on common plane with the recessed interconnect surface.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Integrated circuits and processes for forming integrated circuits are provided herein. The processes involve formation of integrated circuits having an embedded electrical interconnect in a substrate of the integrated circuits when a barrier layer is disposed between the embedded electrical interconnect and the substrate and when the substrate includes an oxide layer. The processes allow the embedded electrical interconnect and the barrier layer to be effectively recessed within the substrate while minimizing etching of the oxide layer. In particular, a protecting layer is disposed over the oxide layer during recessing of the embedded electrical interconnect and the barrier layer within the substrate, and at least a portion of the protecting layer remains over the oxide layer after recessing the barrier layer. In this manner, etching techniques that preferentially etch the barrier layer can be employed to recess the barrier layer. While etching techniques that preferentially etch the barrier layer may otherwise etch the oxide layer at a high rate, thereby breaking down and causing uneven topography of the oxide layer, etching of the oxide layer is minimized because the oxide layer is at least partially shielded from etching by the protecting layer. The protecting layer is removed after recessing the barrier layer. As a result, the embedded electrical interconnect and the barrier layer can be recessed to recess depths that are on a common plane, which promotes further layer formation over the recessed embedded electrical interconnect and barrier layer and which further results in maximized electrical insulation of the embedded electrical interconnect and barrier layer. The processes for forming integrated circuits, as described herein, are particularly useful for recessing embedded electrical interconnects and barrier layers within an interlayer dielectric substrate of an integrated circuit due to the maximized electrical insulation and promotion of further layer formation that is afforded by the processes.

Figure 1:
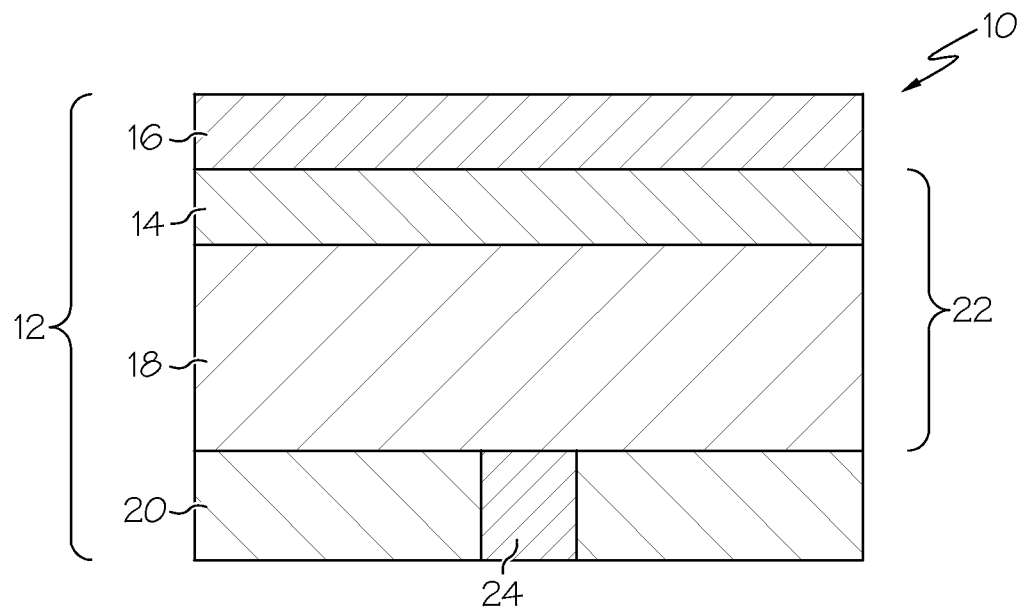
FIG. 1 is a schematic cross-sectional side view of a portion of an integrated circuit including a base substrate, an underlying dielectric layer, an oxide layer, and a protecting layer.

In an embodiment of a process for forming an integrated circuit having an embedded electrical interconnect within a substrate, as schematically shown in cross-section in FIG. 1, the process includes providing the substrate 12 that includes an oxide layer 14 and a protecting layer 16 that is disposed over the oxide layer 14. Optionally, as also shown in FIG. 1, the substrate 12 further includes an underlying dielectric layer 18, with the oxide layer 14 disposed over the underlying dielectric layer 18. Additionally, the substrate 12 may optionally include a base substrate 20, with the underlying dielectric layer 18 disposed over the base substrate 20. For purposes of the instant application, the oxide layer 14 and optional underlying dielectric layer 18, together with any other optional dielectric layers that remain after forming the integrated circuit in a given level of embedded electrical interconnects, may be referred to as an interlayer dielectric substrate 22. In the embodiment of FIG. 1, the oxide layer 14 is provided with the protecting layer 16 disposed directly thereon, with the oxide layer 14 disposed directly on the underlying dielectric layer 18, and with the underlying dielectric layer 18 disposed directly on the base substrate 20. However, it is to be appreciated that in other embodiments, additional layers can be disposed between the oxide layer 14 and the protecting layer 16, between the oxide layer 14 and the underlying dielectric layer 18, and/or between the underlying dielectric layer 18 and the base substrate 20. Further, the oxide layer 14, protecting layer 16, underlying dielectric layer 18, and the base substrate 20 are generally configured in a stacked orientation.

Referring to FIG. 1, when included, the base substrate 20 may have an embedded electrical contact 24 disposed therein, and may include millions of embedded electrical contacts 24 disposed therein. In this regard, the embedded electrical contacts 24 may be formed with nanometer-scale dimensions, e.g., with dimensions less than $1 \times 10^{-6}$ mm. As shown in FIG. 1, the base substrate 20 may be a base dielectric substrate 12 including the embedded electrical contact 24 disposed therein, and may be formed from any dielectric material or may include layers of different dielectric materials. Alternatively, although not shown, the base substrate 20 may be a semiconductor substrate 12 that includes a device, such as a transistor, capacitor, resistor, or the like, with the embedded electrical contact 24 being in electrical communication with the device. Alternatively still, although again not shown, the base substrate 20 may be free of embedded electrical contacts 24 disposed therein and may be any substrate 12 upon which subsequent layers of dielectric material may be formed.

Figure 10:
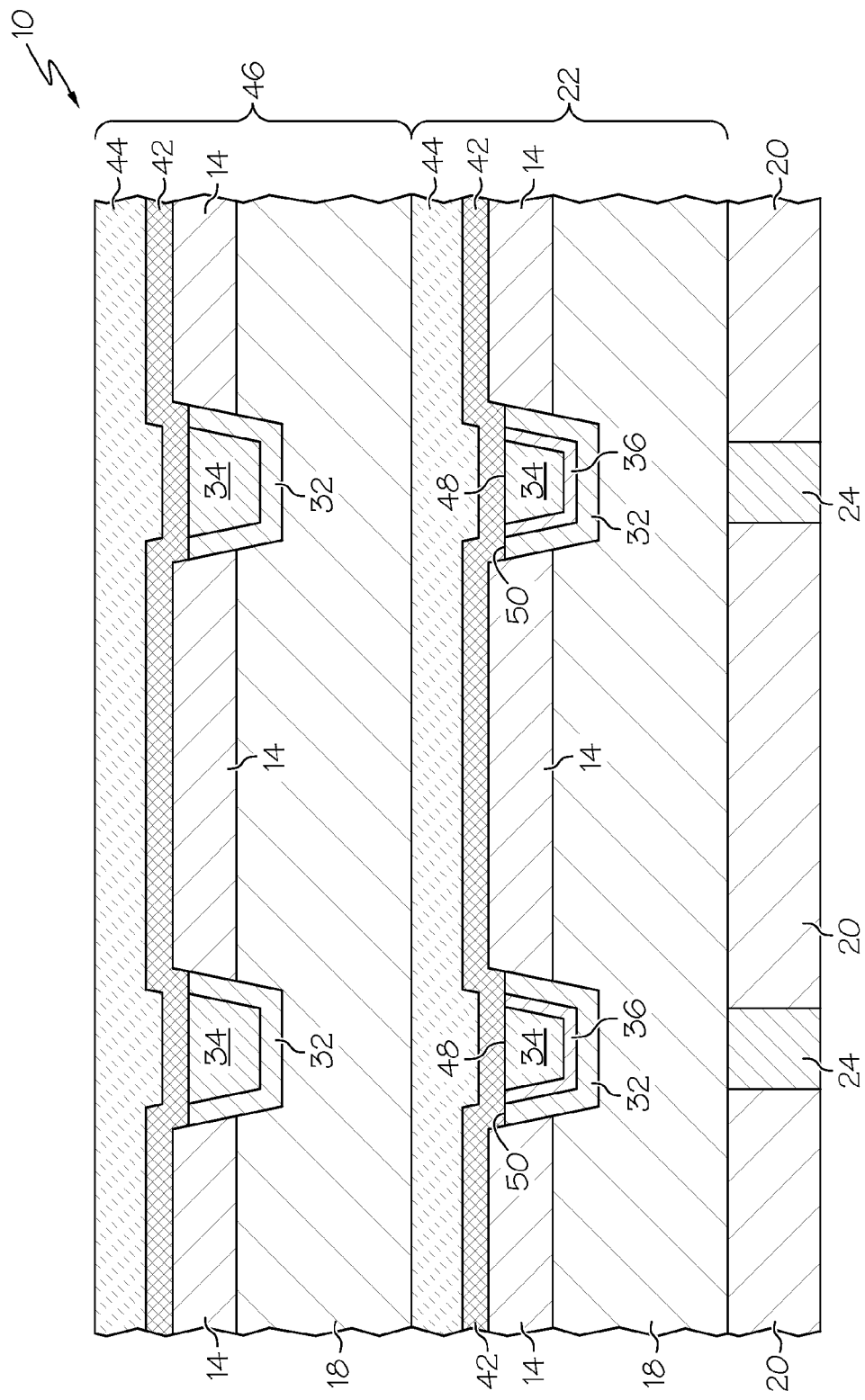
FIG. 10 is a schematic cross-sectional side view of a portion of an embodiment of an integrated circuit prepared in accordance with the processes described herein.

The optional underlying dielectric layer 18, depending upon the particular application, can be formed from a low k or ultra-low k dielectric material, such as a silsesquioxane polymer, so long as the material used to form the underlying dielectric layer 18 is different from the material used to form the oxide layer 14. Such low k or ultra-low k dielectric materials are known in the art and are particularly useful when the instant process is utilized to form integrated circuits 10 as shown in FIG. 10. The underlying dielectric layer 18 may be formed over the base substrate 20 through conventional techniques such as spin coating.

The oxide layer 14 can be formed from any insulating oxide, and is typically formed from a silicon oxide, such as silicon dioxide. For example, tetraethyl orthosilicate (TEOS) precursor may be employed to form the silicon dioxide that forms the oxide layer 14. Formation of oxide layers using TEOS precursor is known in the art, and such oxide layers may be formed through conventional techniques such as chemical vapor deposition (CVD).

The protecting layer 16 is not particularly limited and is a sacrificial layer that is present for purposes of shielding the oxide layer 14 from processing techniques that are conducted in accordance with the instant process that would otherwise degrade or remove material from the oxide layer 14. For example, the protecting layer 16 can be formed from material that exhibits a slower etch rate in a dry etchant than the material used to form the oxide layer 14. In an embodiment, the protecting layer 16 is formed from material that has a higher wet etch rate than dry etch rate. In one specific embodiment, the protecting layer 16 includes titanium nitride and can be formed through conventional techniques such as chemical vapor deposition (CVD).

Figure 2A:
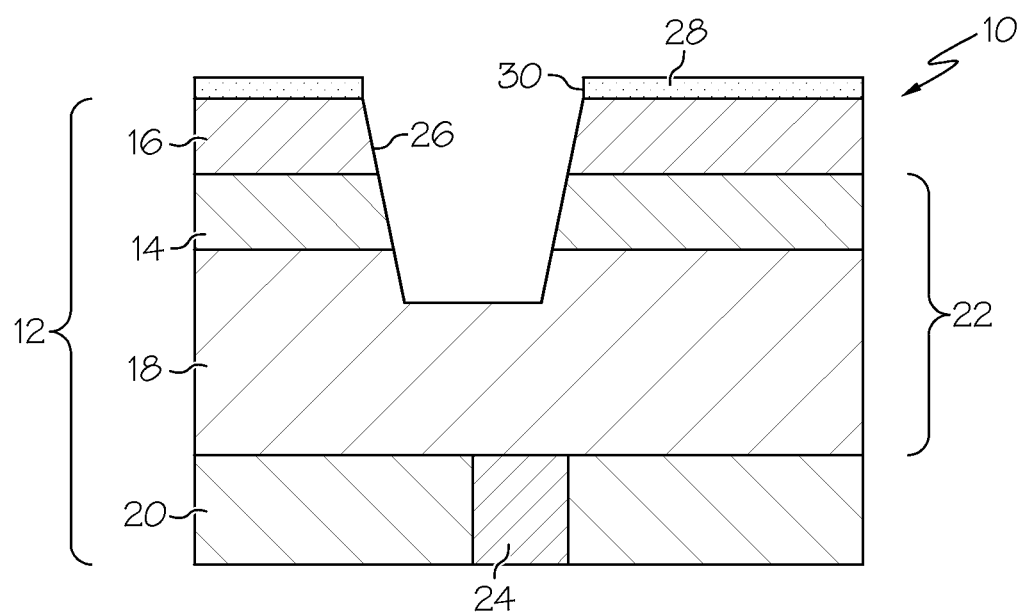
FIG. 2A is a schematic cross-sectional side view of a portion of the integrated circuit of FIG. 1 including an etch mask patterned over the protecting layer, with the etch mask having a patterned recess and with a recess etched through the protecting layer and the oxide layer and partially into the underlying dielectric layer.
Figure 2B:
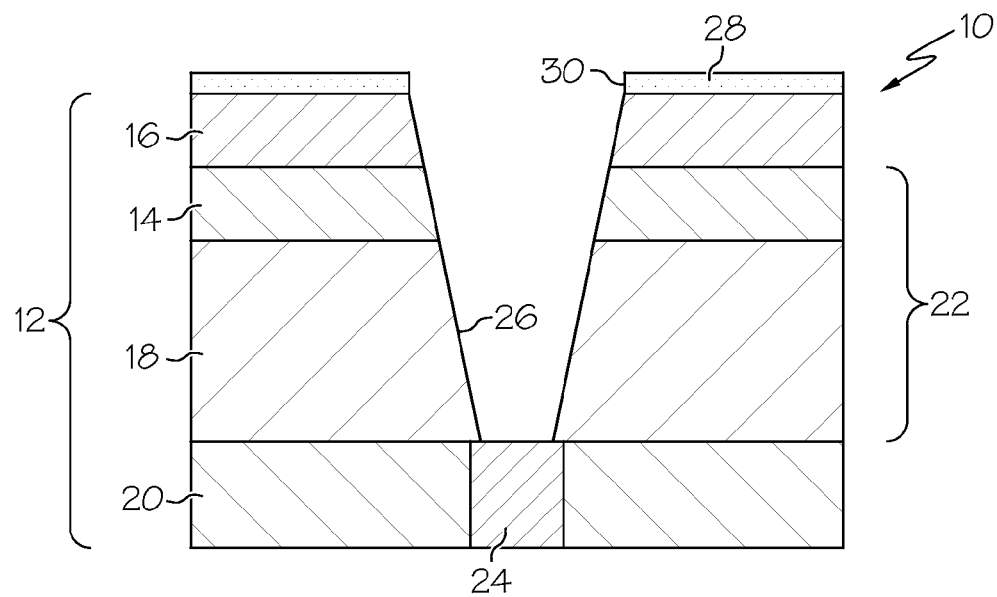
FIG. 2B is a schematic cross-sectional side view of a portion of the integrated circuit of FIG. 1 including an etch mask patterned over the protecting layer, with the etch mask having a patterned recess and with a recess etched through the protecting layer, the oxide layer, and the underlying dielectric layer.

The exemplary process continues with etching a recess 26 through the protecting layer 16 and at least partially into the oxide layer 14 as shown in FIGS. 2A and 2B. Although not shown, it is to be appreciated that a plurality of recesses 26 can be etched. To etch the recess 26, an etch mask 28 may be formed and patterned over the protecting layer 16, with the etch mask 28 having patterned recesses 30 that selectively expose a surface of the protecting layer 16. The recess 26 is then etched through the protecting layer 16 and at least partially into the oxide layer 14 through the patterned recesses 30 in the etch mask 28, with multiple cycles of etching conducted with appropriate etchants for at least the protecting layer 16 and the oxide layer 14. In the embodiments shown in FIGS. 2A and 2B, the recess 26 is etched through the oxide layer 14 and at least partially into the underlying dielectric layer 18. In the embodiment of FIG. 2A, the recess 26 is etched through the protecting layer 16, the oxide layer 14, and only partially into the underlying dielectric layer 18 and illustrates formation of the recess 26 in a trench configuration. In the embodiment of FIG. 2B, the recess 26 is a via 26 and is etched through the protecting layer 16, the oxide layer 14, and the underlying dielectric layer 18. For example, when the protecting layer 16 includes titanium nitride, dry etching using etchants such as, but not limited to, $CHF_3$, $CF_4$, or $SF_6$, can be used to etch both the protecting layer 16 and the oxide layer 14. In this embodiment, the via 26 is etched over the embedded electrical contact 24 that is disposed in the base substrate 20 and exposes a surface of the embedded electrical contact 24.

Figure 3:
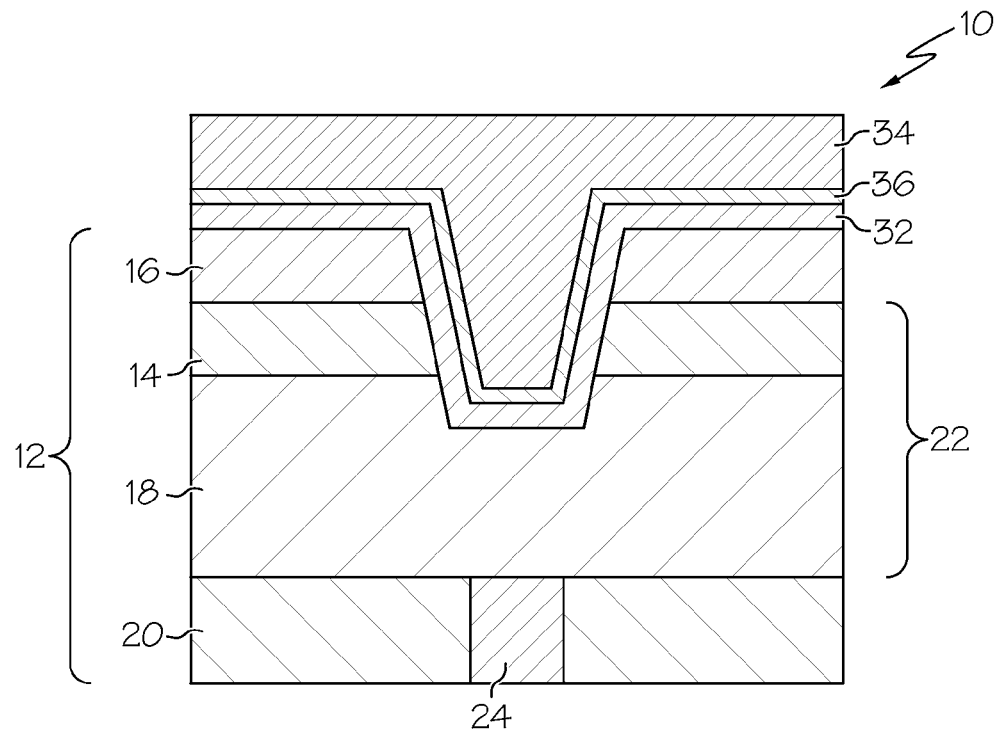
FIG. 3 is a schematic cross-sectional side view of a portion of the integrated circuit of FIG. 2A including the recess, with a barrier material, a liner material, and an electrically-conductive material deposited over the protecting layer and in the recess to form a barrier layer, liner layer, and embedded electrical interconnect, respectfully, in the recess.

Referring to FIG. 3, a barrier material is deposited in the recess 26 to form a barrier layer 32 over the protecting layer 16 and oxide layer 14 in the recess 26, followed by depositing an electrically-conductive material over the barrier layer 32 in the recess 26 to form an embedded electrical interconnect 34. The barrier layer 32 functions as a barrier to diffusion of metal ions from the electrically-conductive material of the embedded electrical interconnect 34 into an interface between layers in the substrate 12. In addition to the barrier layer 32, a liner material may be deposited over the barrier layer 32 in the recess 26 to form a liner layer 36, which provides a further barrier to diffusion of the metal ions. When the liner layer 36 is present, the electrically-conductive material is deposited over the liner layer 36. In an embodiment, and as shown in FIG. 3, the electrically-conductive material is deposited directly upon the liner layer 36. It is to be appreciated that the barrier material, the liner material, and the electrically-conductive material are generally uniformly deposited over the substrate 12, including over the surface of the protecting layer 16 in addition to depositing in the recess 26.

Techniques for forming barrier layers 32, liner layers 36, and embedded electrical interconnects 34 are known in the art. The barrier layer 32 is generally formed from a barrier material that is different from materials that are used to form the protecting layer 16, the oxide layer 14, and the optional underlying dielectric layer 18. In an embodiment, the barrier material is a refractory metal nitride, such as a nitride of niobium, molybdenum, tantalum, tungsten, or rhenium. Refractory metal nitrides provide excellent diffusion barrier properties and that also exhibits chemical stability and high electrical conductivity. One specific example of a suitable refractory metal nitride that is suitable for the barrier material is tantalum nitride. When the liner layer 36 is formed, the liner material is different from the barrier material and, in an embodiment, is chosen from, but is not limited to, elemental tantalum, cobalt, rhenium, niobium, vanadium, ruthenium, or a combination thereof. The electrically-conductive material is different from the barrier material and liner material and has sufficient electrical conductivity to facilitate electrical connection in a circuit, e.g., with electrical resistivity of less than or equal to about 30 μΩ·cm. Examples of suitable electrically-conductive materials include metals such as, but not limited to, copper, titanium, or tungsten. In an embodiment, the electrically-conductive material is substantially pure copper (e.g., at least about 99% pure) and may be electronics grade copper that is suitable for sensitive circuitry of integrated circuits 10. In an embodiment, the embedded electrical interconnect 34 is in the form of one or more dots and/or lines, depending upon a pattern of recesses 26 formed in the substrate 12.

Figure 4:
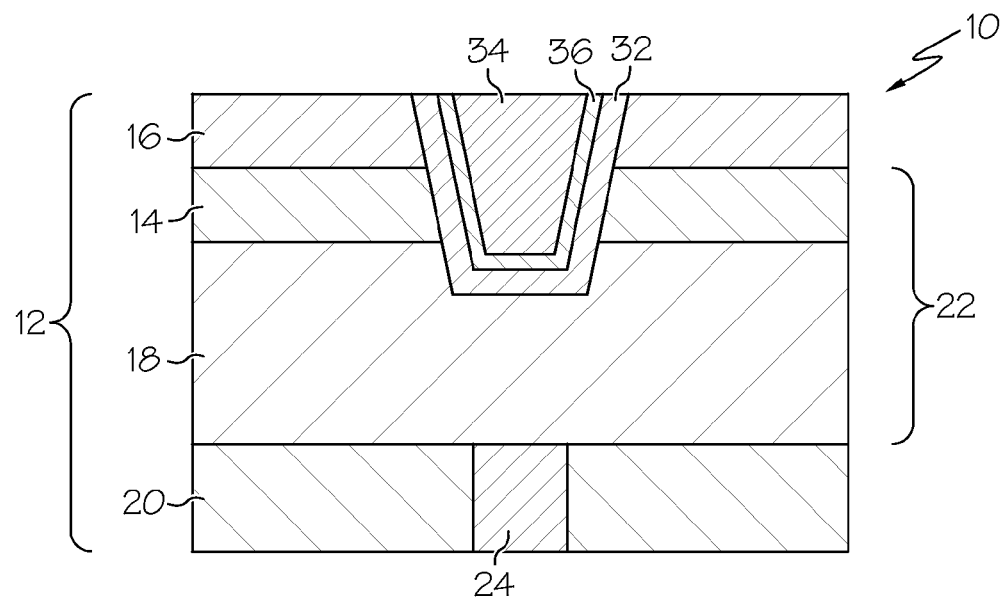
FIG. 4 is a schematic cross-sectional side view of a portion of the integrated circuit of FIG. 3 after removal of excess barrier material, liner material, and electrically-conductive material from the protecting layer.

After depositing the electrically-conductive material to form the embedded electrical interconnect 34, and as shown in FIG. 4, excess barrier material, liner material when present, and electrically-conductive material that is deposited over the protecting layer 16 outside of the recess 26 is removed to expose a surface of the protecting layer 16 prior to recessing the embedded electrical interconnect 34, as described in further detail below. Chemical mechanical planarization (CMP) can be used to remove the excess barrier material, the excess liner material when present, and the excess electrically-conductive material. A surface of the embedded electrical interconnect 34 is also exposed after removing the excess material outside of the recess 26.

Figure 5:
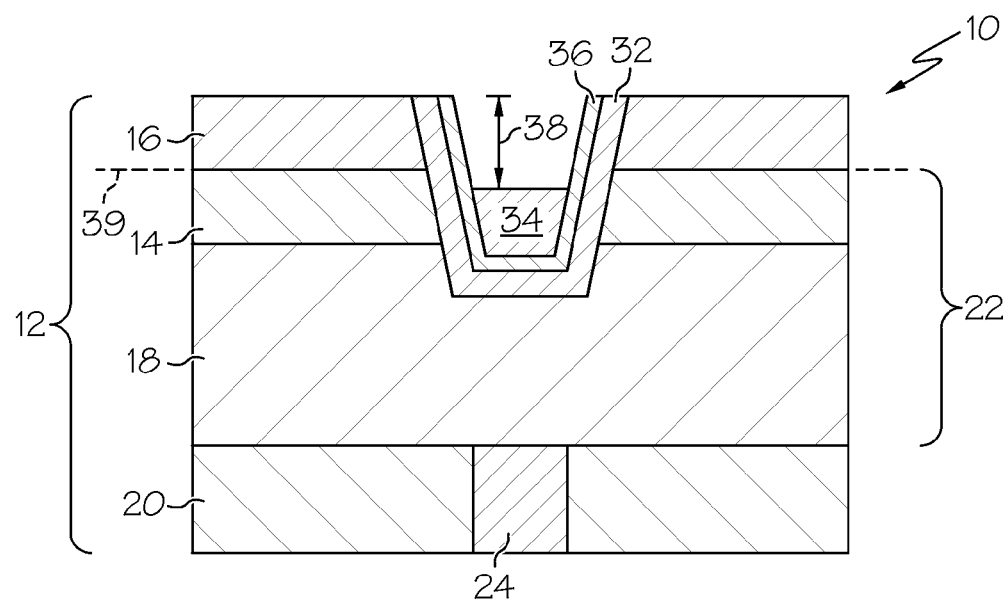
FIG. 5 is a schematic cross-sectional side view of a portion of the integrated circuit of FIG. 4, with the embedded electrical interconnect recessed within the substrate.

As alluded to above, and as shown in FIG. 5, the process continues with recessing the embedded electrical interconnect 34 within the substrate 12. In an embodiment, the embedded electrical interconnect 34 is recessed by wet etching the embedded electrical interconnect 34. An appropriate wet etchant may be used to wet etch the embedded electrical interconnect 34, such as Standard Clean 1 (SC1), Standard Clean 2 (SC2), or other peroxide based chemistries to oxidize the metal followed by HF or citric acid to remove the metal oxide layer. The embedded electrical interconnect 34 is recessed to an interconnect recess depth 38, and etching may be conducted until a desired interconnect recess depth 38 is achieved. The interconnect recess depth 38 is at least beneath a surface plane 39 of the oxide layer 14, thereby offsetting the embedded electrical interconnect 34 from the surface plane 39 of the oxide layer 14 and effectively forming a barrier to flow of metal ions from the embedded electrical interconnect 34 into the interface between the oxide layer 14 and a subsequently formed capping layer (as described in further detail below). In an embodiment, the interconnect recess depth 38 is at least 4 nm beneath the surface plane 39 of the oxide layer 14.

Figure 6:
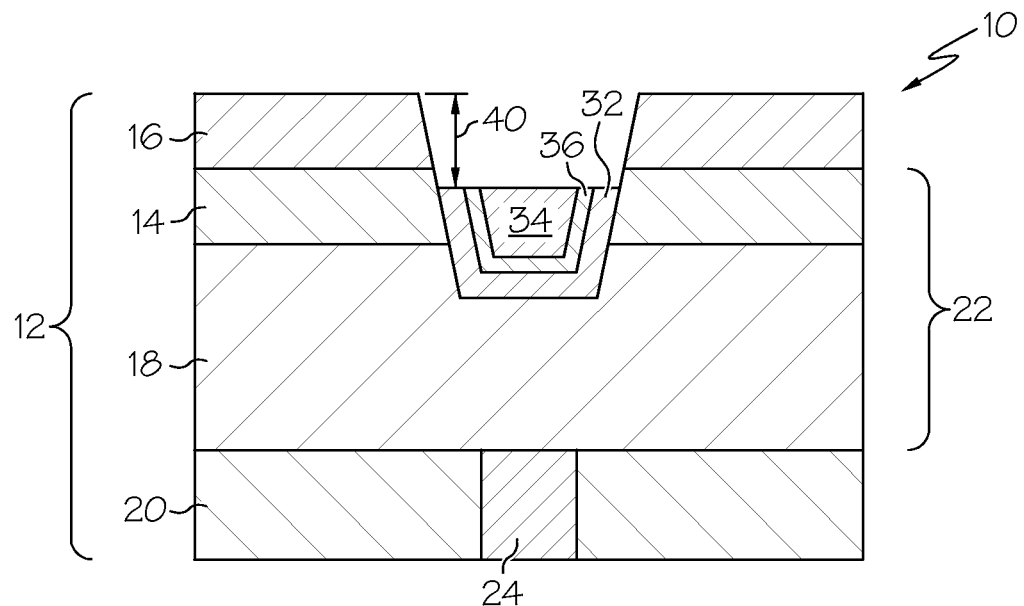
FIG. 6 is a schematic cross-sectional side view of a portion of the integrated circuit of FIG. 5, with the barrier layer and liner layer recessed within the substrate.

Referring to FIG. 6, after recessing the embedded electrical interconnect 34, the barrier layer 32 is recessed within the substrate 12. The barrier material and the liner material generally have a lower etch rate in the wet etchant than the electrically-conductive material such that wet etching is insufficient to effectively etch the barrier material and liner material (when present). In an embodiment, the barrier layer 32 and the liner layer 36 are recessed by dry etching. Dry etching is also referred to in the art as plasma etching and examples of suitable etchants that can be used in dry etching include, but are not limited to, $CHF_3$, $CF_4$, or $SF_6$. Because dry etching using the aforementioned etchants is also generally effective for etching oxides, the oxide layer 14 is vulnerable to etch if exposed to dry etching. However, the protecting layer 16 is still present over the oxide layer 14 during recessing of the embedded electrical interconnect 34 and the barrier layer 32. In this regard, at least a portion of the protecting layer 16 remains over the oxide layer 14 after recessing the barrier layer 32 to ensure that the oxide layer 14 is sufficiently shielded from exposure to dry etching.

The barrier layer 32 and, when present, the liner layer 36 are recessed to a barrier recess depth 40. In an embodiment, to provide an even surface upon which further layers may be formed, the barrier recess depth 40 is on common plane with the interconnect recess depth 38. By "common plane", it is meant that the barrier recess depth 40 and the interconnect recess depth 38 have an offset of less than about 2 nm, such as from an equal plane to an offset of about 7 nm.

Figure 7:
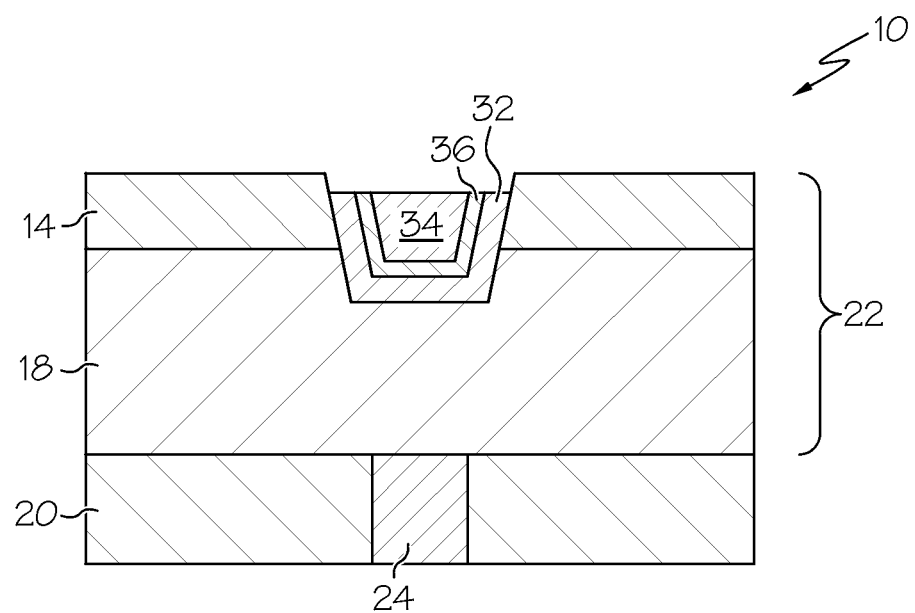
FIG. 7 is a schematic cross-sectional side view of a portion of the integrated circuit of FIG. 6, after removal of the protecting layer.

Once the embedded electrical interconnect 34 and barrier layer 32 are recessed within the substrate 12, the protecting layer 16 is removed from the oxide layer 14 as shown in FIG. 7. Techniques for removing the protecting layer 16 are not particularly limited and can include CMP or wet etching, thereby exposing a surface of the oxide layer 14.

Figure 8:
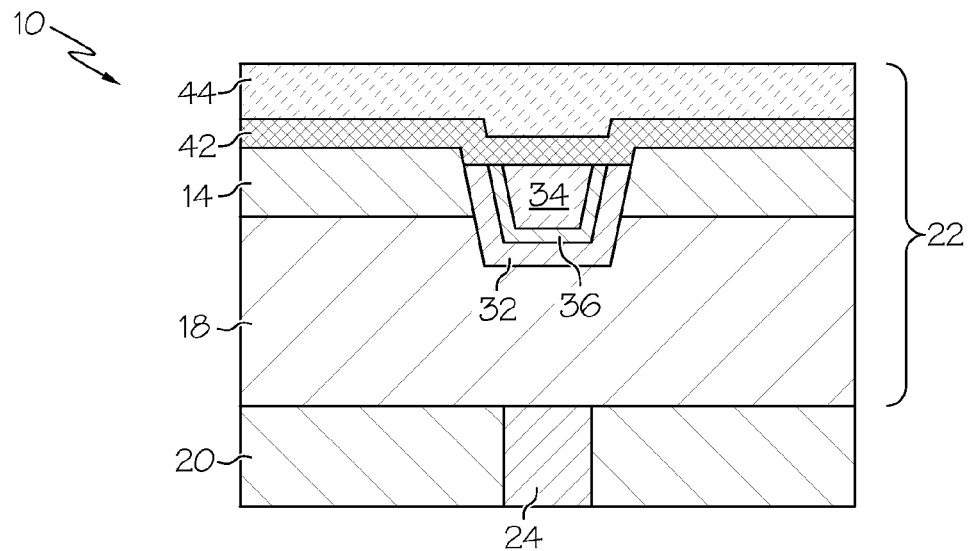
FIG. 8 is a schematic cross-sectional side view of a portion of the integrated circuit of FIG. 7, with a capping layer and an NBLoK layer formed over the embedded electrical interconnect and the oxide layer.
Figure 9:
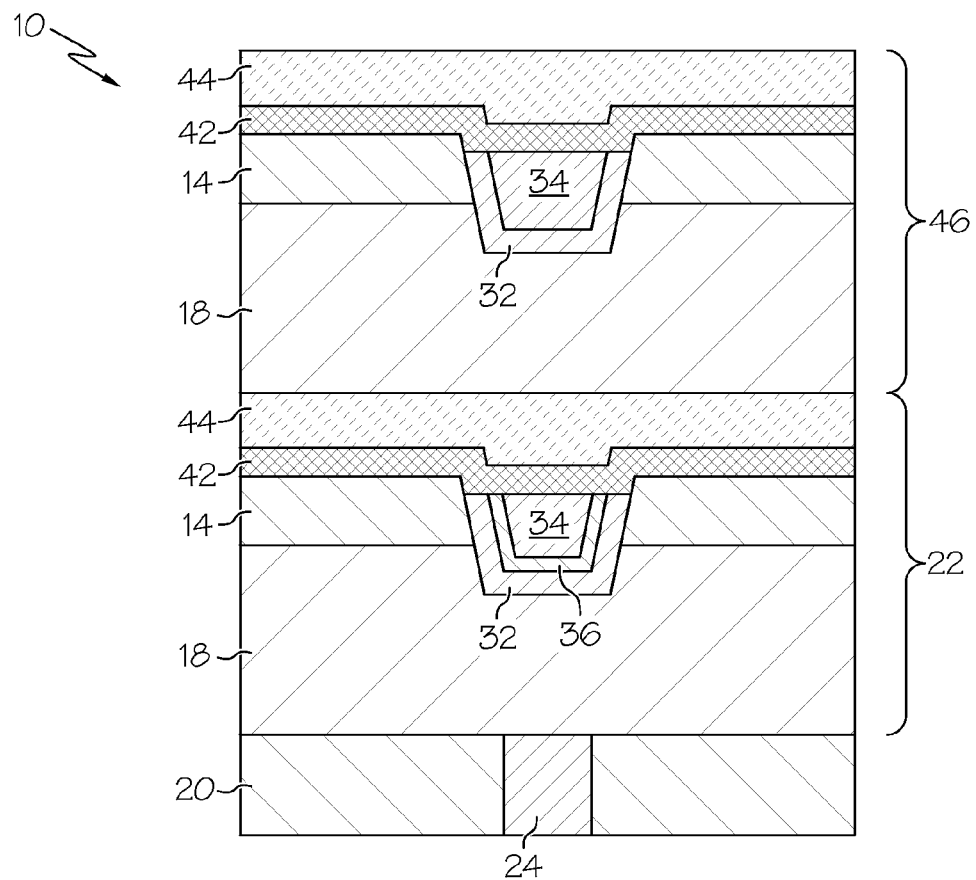
FIG. 9 is a schematic cross-sectional side view of a portion of the integrated circuit of FIG. 8, with an overlying substrate having another embedded electrical interconnect formed over the capping layer and NBLoK layer.

Referring to FIG. 8, once the embedded electrical interconnect 34 and the barrier layer 32 are recessed within the substrate 12, and once the protecting layer 16 is removed, additional layers may be deposited over the embedded electrical interconnect 34, the oxide layer 14, and other features in accordance with fabrication techniques known in the art. For example, in an embodiment and as shown in FIG. 8, a capping layer 42 is formed over the embedded electrical interconnect 34 and barrier layer 32 after recessing the embedded electrical interconnect 34 and barrier layer 32 and after removing the protecting layer 16. The capping layer 42 is typically formed from a dielectric material and serves to passivate the embedded electrical interconnect 34 within the substrate 12. In an embodiment, the capping layer 42 includes silicon nitride and is formed directly over the oxide layer 14, the embedded electrical interconnect 34, and the barrier layer 32, followed by formation of a $SiN_xC_yH_z$ layer 44 (referred to in the art as NBLoK; shown in FIG. 8). As shown in FIG. 8, the capping layer 42 and the NBLoK layer 44 that are formed over the embedded electrical interconnect 34 may be considered part of the interlayer dielectric substrate 22 as the capping layer 42 may serve to electrically isolate the embedded electrical interconnect 34 from other embedded electrical interconnects 34 that may subsequently be formed in additional overlaying substrates 46, and the NBLoK layer 44 may serve to provide further dielectric insulation between the embedded electrical interconnect 34 and the additional overlaying substrate 12 as well as to provide etch-stop functions during formation of recesses as vias in the additional overlaying substrate 12. Alternatively, the capping layer 42 and NBLoK layer 44 may perform other functions as may be desirable in accordance with design considerations. In an embodiment, as shown in cross-section in FIG. 9 and as alluded to above, an overlying substrate 46 having another embedded electrical interconnect 34 may be formed over the capping layer 42 (more specifically, directly over the NBLoK layer 44).

As set forth above, and as partially shown in FIG. 10, an integrated circuit 10 is provided in accordance with the instant invention. The integrated circuit 10 includes a base substrate 20 and an interlayer dielectric substrate 22 disposed over the base substrate 20. The interlayer dielectric substrate 22 has an embedded electrical interconnect 34 disposed therein and a barrier layer 32 disposed between the embedded electrical interconnect 34 and the interlayer dielectric substrate 22. The embedded electrical interconnect 34 and the barrier layer 32 are recessed within the interlayer dielectric substrate 22 and have a recessed interconnect surface 48 and a recessed barrier surface 50, respectively. The recessed barrier surface 50 is on common plane with the recessed interconnect surface 48. The integrated circuit 10 may include a capping layer 42 disposed over and in contact with the embedded electrical interconnect 34. An overlying substrate 46 having another embedded electrical interconnect 34 disposed therein may be disposed over the capping layer 42. While the integrated circuit 10 can be prepared in accordance with the processes described herein, the integrated circuits are not so limited and can be prepared in accordance with other processes so long as the above-described surface roughness of the recessed surface in the embedded copper interconnect is achieved.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A process for forming an integrated circuit, the process comprising:
   providing a substrate comprising an oxide layer and a protecting layer disposed over the oxide layer;
   etching a recess through the protecting layer and at least partially into the oxide layer;
   depositing a barrier material in the recess to form a barrier layer over the protecting layer and the oxide layer in the recess;
   depositing an electrically-conductive material different from the barrier material over the barrier layer in the recess to form an embedded electrical interconnect;
   recessing the embedded electrical interconnect to an interconnect recess depth within the substrate;
   recessing the barrier layer to a barrier recess depth within the substrate after recessing the embedded electrical interconnect, wherein at least a portion of the protecting layer remains over the oxide layer after recessing the barrier layer;
   removing the protecting layer from the oxide layer after recessing the barrier layer; and
   forming a capping layer within the recess directly over the embedded electrical interconnect and the barrier layer that have been recessed, and directly over the oxide layer after removing the protecting layer from the oxide layer, wherein the capping layer comprises dielectric material.

2. The process of claim 1, wherein the oxide layer is provided with the protecting layer disposed directly thereon.

3. The process of claim 1, wherein providing the protecting layer comprises providing the protecting layer comprising titanium nitride.

4. The process of claim 1, wherein recessing the barrier layer comprises dry etching the barrier layer.

5. The process of claim 4, wherein recessing the embedded electrical interconnect comprises wet etching the embedded electrical interconnect.

6. The process of claim 1, wherein the barrier layer is recessed to the barrier recess depth that is on common plane with the interconnect recess depth.

7. The process of claim 1, wherein depositing the barrier material is further defined as depositing the barrier material comprising tantalum nitride to form the barrier layer comprising tantalum nitride.

8. The process of claim 1, further comprising depositing a liner material over the barrier layer in the recess to form a liner layer, and wherein depositing the electrically-conductive material over the barrier layer is further defined as depositing the electrically-conductive material over the liner layer.

9. The process of claim 8, wherein the electrically-conductive material is deposited directly upon the liner layer.

10. The process of claim 1, wherein excess barrier material and excess electrically-conductive material is further deposited over the protecting layer outside of the recess, and wherein the excess barrier material and the excess electrically-conductive material outside of the recess are removed through chemical mechanical planarization to expose a surface of the protecting layer prior to recessing the embedded electrical interconnect.

11. The process of claim 1, wherein the substrate further comprises an underlying dielectric layer with the oxide layer disposed over the underlying dielectric layer, and wherein the recess is etched through the oxide layer and at least partially into the underlying dielectric layer.

12. The process of claim 11, wherein etching the recess comprises etching a via through the protecting layer, the oxide layer, and the underlying dielectric layer.

13. The process of claim 12, wherein the substrate further comprises a base substrate having an embedded electrical contact disposed therein and with the underlying dielectric layer disposed over the base substrate, and wherein the via is etched over the embedded electrical contact disposed in the base substrate and exposes a surface of the embedded electrical contact.

14. The process of claim 1, further comprising forming an overlying substrate having another embedded electrical interconnect over the capping layer.

15. A process for forming an integrated circuit, the process comprising:
   providing a substrate comprising an underlying dielectric layer, an oxide layer disposed over the underlying dielectric layer, and a protecting layer disposed over the oxide layer;
   etching a recess through the protecting layer, at least partially into the oxide layer, and optionally at least partially into the underlying dielectric layer;
   depositing a barrier material in the recess to form a barrier layer over the protecting layer, the oxide layer, and optionally the underlying dielectric layer in the recess;
   depositing a liner material different from the barrier material over the barrier layer in the recess to form a liner layer;
   depositing an electrically-conductive material over the liner layer in the recess to form an embedded electrical interconnect;
   wet etching the embedded electrical interconnect to an interconnect recess depth within the substrate;
   dry etching the barrier layer to a barrier recess depth within the substrate after recessing the embedded electrical interconnect, wherein at least a portion of the protecting layer remains over the oxide layer after recessing the barrier layer;
   removing the protecting layer from the oxide layer after recessing the barrier layer; and forming a capping layer within the recess directly over the embedded electrical interconnect and the barrier layer that have been recessed, and directly over the oxide layer after removing the protecting layer from the oxide layer, wherein the capping layer comprises dielectric material.

16. The process of claim 15, wherein the substrate further comprises a base substrate having an embedded electrical contact disposed therein and with the underlying dielectric layer disposed over the base substrate, and wherein etching the recess comprises etching a via through the protecting layer, the oxide layer, and the underlying dielectric layer over the embedded electrical contact in the base substrate to expose a surface of the embedded electrical contact.

17. The process of claim 15, further comprising forming an overlying substrate having another embedded electrical interconnect over the capping layer.

* * * * *